United States Patent
Ogura

(10) Patent No.: US 10,881,024 B2
(45) Date of Patent: Dec. 29, 2020

(54) ELECTRONIC DEVICE HAVING A HERMETICALLY SEALED HOUSING WITH INTERNAL PROJECTION

(71) Applicant: Murata Manufacturing Co., Ltd., Nagaokakyo (JP)

(72) Inventor: Taku Ogura, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 0 days.

(21) Appl. No.: 16/182,910

(22) Filed: Nov. 7, 2018

(65) Prior Publication Data

US 2019/0166722 A1    May 30, 2019

(30) Foreign Application Priority Data

Nov. 28, 2017  (JP) .................. 2017-228069

(51) Int. Cl.
| | |
|---|---|
| H05K 7/20 | (2006.01) |
| H05K 7/14 | (2006.01) |
| H05K 1/02 | (2006.01) |
| H05K 1/18 | (2006.01) |
| H05K 5/06 | (2006.01) |

(52) U.S. Cl.
CPC ....... *H05K 7/20436* (2013.01); *H05K 1/0204* (2013.01); *H05K 1/181* (2013.01); *H05K 5/069* (2013.01); *H05K 7/1427* (2013.01); *H05K 7/209* (2013.01); *H05K 7/20409* (2013.01); *H05K 7/20472* (2013.01); *H05K 2201/1003* (2013.01)

(58) Field of Classification Search
CPC ........... H05K 7/20409; H05K 7/20418; H05K 7/20445; H05K 7/20436; H05K 7/209; H05K 7/2039; H05K 7/1427; H05K 5/069; H05K 1/0204; H05K 1/181; H05K 2201/1003; H01L 23/3675; H01L 23/367; H01L 23/28; H01L 23/3672; H01L 23/3736; H01L 23/3738; G06F 1/20; G06F 1/181
USPC ................ 361/704–723; 257/712–713, 720; 174/15.1, 16.3, 526, 547–548
See application file for complete search history.

(56) References Cited

U.S. PATENT DOCUMENTS

| | | | | |
|---|---|---|---|---|
| 5,659,458 A | * | 8/1997 | Patchen | H01L 23/3677 257/678 |
| 5,661,902 A | * | 9/1997 | Katchmar | H01L 23/3672 174/252 |
| 7,131,193 B2 | * | 11/2006 | Fartash | H05K 3/301 29/830 |

(Continued)

FOREIGN PATENT DOCUMENTS

| | | |
|---|---|---|
| JP | 2010267645 A | 11/2010 |
| JP | 2011-18932 A | 1/2011 |

(Continued)

*Primary Examiner* — Zachary Pape
*Assistant Examiner* — Amir A Jalali
(74) *Attorney, Agent, or Firm* — Arent Fox LLP

(57) ABSTRACT

An electronic device that includes a printed board with a surface over which a heating element is mounted, and a hermetically sealed housing that has thermal conductivity and accommodates the printed board therein. The printed board has a through hole therein, and a projection on a surface of the housing is thermally coupled to the heating element through the through hole.

15 Claims, 2 Drawing Sheets

(56) References Cited

U.S. PATENT DOCUMENTS

| | | | | |
|---|---|---|---|---|
| 7,294,007 B1* | 11/2007 | Lawlyes | H05K 5/0082 | 439/276 |
| 7,903,422 B2* | 3/2011 | Watanabe | G06F 1/203 | 174/252 |
| 8,472,197 B2* | 6/2013 | Higashibata | B60R 16/0239 | 165/185 |
| 2004/0136162 A1* | 7/2004 | Asai | H05K 1/0207 | 361/715 |
| 2006/0103008 A1* | 5/2006 | Ong | H01L 23/367 | 257/706 |
| 2006/0134937 A1* | 6/2006 | Mayuzumi | H05K 5/0034 | 439/61 |
| 2009/0057872 A1* | 3/2009 | Ehlers | H01L 24/06 | 257/698 |
| 2010/0177483 A1* | 7/2010 | Yoshimoto | H05K 5/0034 | 361/714 |
| 2010/0254093 A1* | 10/2010 | Oota | B60R 16/0239 | 361/720 |
| 2013/0229255 A1* | 9/2013 | Shih | H01F 27/06 | 336/220 |
| 2014/0112015 A1* | 4/2014 | Kurebayashi | B60Q 1/0094 | 362/547 |
| 2014/0259640 A1* | 9/2014 | Sakamoto | H01F 27/022 | 29/602.1 |
| 2015/0054148 A1* | 2/2015 | Jang | H01L 23/36 | 257/713 |
| 2015/0097646 A1* | 4/2015 | Park | H01F 5/06 | 336/185 |
| 2015/0289357 A1* | 10/2015 | Wakana | H05K 1/181 | 174/535 |
| 2016/0183405 A1* | 6/2016 | Sanada | H01L 23/433 | 361/694 |
| 2016/0190034 A1* | 6/2016 | Okamotoa | H01L 23/49838 | 257/692 |
| 2017/0214330 A1* | 7/2017 | Yang | H02M 3/285 | |
| 2017/0271221 A1* | 9/2017 | Bovaird | H01L 23/66 | |
| 2018/0027646 A1* | 1/2018 | Sumida | H05K 7/20854 | 361/720 |
| 2018/0114735 A1* | 4/2018 | Nakamura | H01L 23/315 | |
| 2019/0050054 A1* | 2/2019 | Stoufer | H05K 1/165 | |
| 2019/0263120 A1* | 8/2019 | Tomimatsu | B41J 2/14233 | |
| 2019/0299881 A1* | 10/2019 | Saito | B60R 16/02 | |
| 2020/0060023 A1* | 2/2020 | Miyamoto | H05K 7/20 | |

FOREIGN PATENT DOCUMENTS

| | | | | |
|---|---|---|---|---|
| JP | 2013021348 A | 1/2013 | | |
| JP | 5762508 B2 | 8/2015 | | |
| WO | WO 2017/122152 A1 * | 7/2017 | | G06F 3/01 |

* cited by examiner

ELECTRONIC DEVICE HAVING A HERMETICALLY SEALED HOUSING WITH INTERNAL PROJECTION

CROSS REFERENCE TO RELATED APPLICATIONS

The present application claims priority to Japanese Patent Application No. 2017-228069, filed Nov. 28, 2017, the entire contents of each of which are incorporated herein by reference.

BACKGROUND OF THE INVENTION

Field of the Invention

The present invention relates to electronic devices where boards on which a large number of electronic components are mounted are accommodated in respective housings.

Description of the Related Art

In a photovoltaic (PV) system for an ordinary household, direct-current (DC) power generated in a solar panel is converted in a power conditioner into commercial alternating-current (AC) power and is supplied to an AC load in the household or a commercial power system.

Specifically, power generated in a solar panel is boosted in voltage by a PV converter, undergoes maximum power point tracking (MPPT) control, and is converted into commercial AC power in an inverter. After that, the inverter supplies the commercial AC power to an AC load or a commercial power system.

If designed for outdoor placement, the power conditioner has a hermetically sealed housing that accommodates therein a PV converter board where a large number of electronic components constituting the PV converter are mounted, an inverter board where a large number of electronic components constituting the inverter are mounted, and the like to prevent penetration of rainwater or foreign substances.

While a reactor and a switching element for boosting a DC voltage are mounted on the PV converter board, a reactor and a switching element for converting DC power into AC power are mounted on the inverter board.

Since the calorific values of such elements are high, efficient radiation of the calorific value of the reactor, which is very high, to the outside of the housing is needed. Since heat cannot be radiated to the outside of the housing using a cooling fan in the above-described hermetically sealed power conditioner, it is needed to efficiently transfer the heat generated from a heating element to a radiator, such as a heat sink, so as to radiate the heat.

Japanese Patent No. 5762508 discloses a structure to radiate the heat generated from a reactor mounted on a board.

In the radiation structure of the reactor disclosed in Japanese Patent No. 5762508, to radiate the heat generated from the reactor mounted on the board, the reactor is accommodated in a casing and a top surface, a side surface, or a bottom surface of the casing is caused to be in contact with a cooler by using a grease. Thus, the casing for accommodating the reactor is needed and as a result, the number of components increases and space for placing the reactor increases as well.

Since a typical reactor is a component with a terminal, normally, the reactor is soldered by a flow process after soldering the other surface-mounted components by a reflow process. Thus, when the reactor has a casing, a problem arises in that there is an increase in design constraints due to the necessity to store the reactor in the casing in advance to achieve a one-time flow process and the necessity to suitably control the amount of the grease to be applied at a stage prior to the flow process.

SUMMARY OF THE INVENTION

The present invention has been conceived in view of such circumstances and is aimed at providing an electronic device that can stably radiate the heat generated from a heating component mounted over a board by using a simple structure.

An electronic device to solve the above-described problem includes a printed board with a surface over which a heating element is mounted, and a hermetically sealed housing that has thermal conductivity and accommodates the printed board therein. The printed board has a through hole therein, and a projection on a surface of the housing is thermally coupled to the heating element through the through hole.

This structure enables the heat generated from the heating element to be radiated to the housing through the projection.

It is preferable that, in the above-described electronic device, the heating element is a toroidal coil and a coil center of the toroidal coil is positioned to accord with centers of the through hole and the projection.

This structure enables the toroidal coil and the projection to be thermally coupled in the through hole substantially evenly in their circumferential direction.

It is preferable that, in the above-described electronic device, the projection be formed integrally with the housing.

This structure enables the heat radiated to the projection to be radiated stably to the housing.

It is preferable that the above-described electronic device further include a heat radiation sheet between the toroidal coil and the projection.

This structure enables the toroidal coil and the projection to be thermally coupled stably.

It is preferable that the above-described electronic device further include a coil mount between the toroidal coil and the printed board.

This structure enables insulation between the toroidal coil and the printed board to be ensured.

It is preferable that, in the above-described electronic device, the projection be formed by cutting out part of a base of the housing.

This structure enables the projection to be integrally formed with the housing.

It is preferable that, in the above-described electronic device, the projection be formed by performing a drawing process on part of a base of the housing.

This structure enables the projection to be integrally formed with the housing.

It is preferable that, in the above-described electronic device, a heat radiation fin be provided on an outer surface of the housing.

This structure enables the heat radiated to the housing to be radiated from the heat radiation fin to the outside of the housing.

Other features, elements, characteristics and advantages of the present invention will become more apparent from the following detailed description of preferred embodiments of the present invention with reference to the attached drawings.

DETAILED DESCRIPTION OF THE PREFERRED EMBODIMENTS

Figure 1:
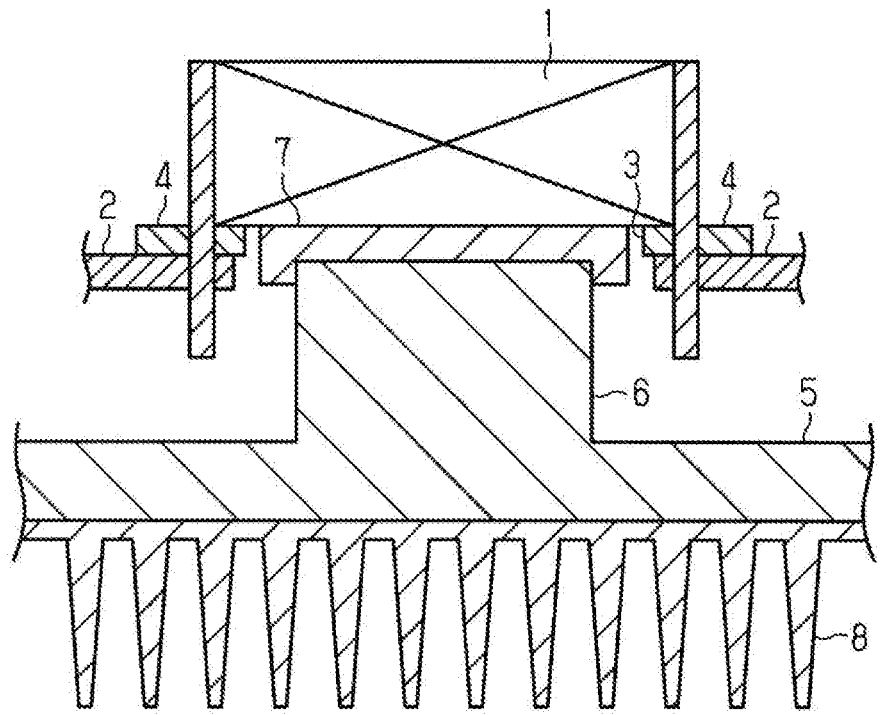
FIG. 1 is a cross-sectional view that illustrates a radiation structure of a toroidal coil according to an embodiment.
Figure 2:
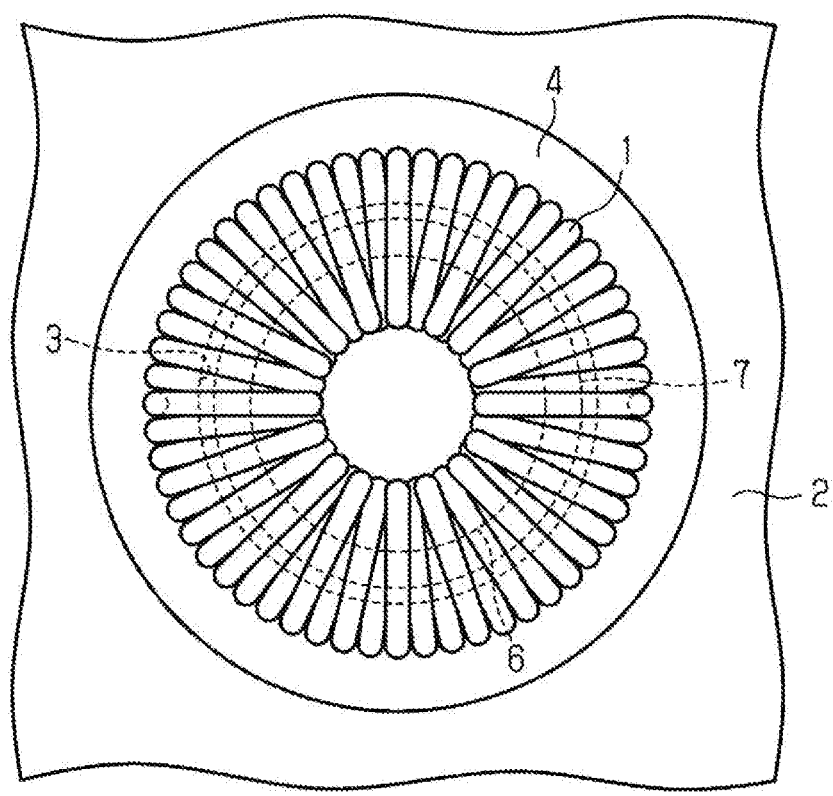
FIG. 2 is a plan view that illustrates the toroidal coil attached over a printed board.

A specific embodiment of the present invention is described below by referring to the drawings. FIGS. 1 and 2 each illustrate part of an inverter board accommodated in a substantially cuboid-like hermetically sealed housing of a power conditioner that constitutes a PV system for an ordinary household.

A toroidal coil 1 is mounted over a printed board 2 as a component that constitutes a PV converter, an inverter circuit that converts DC power with a voltage boosted in the PV converter into AC power, or both of the PV converter and the inverter circuit.

A through hole 3, which is substantially circular, is formed in the printed board 2 in a position where the toroidal coil 1 is mounted. The through hole 3 is made to have a diameter slightly smaller than the outside diameter of the toroidal coil 1. Both ends of a conducting wire that constitutes the coil are inserted into the printed board 2 around the through hole 3 and soldered. The toroidal coil 1 is mounted over the printed board 2 so that the coil center of the toroidal coil 1 accords approximately with the center of the through hole 3. It is not necessarily needed for the coil center of the toroidal coil 1 and the center of the through hole 3 to substantially accord with each other, and it is at least desired that both ends of the conducting wire of the toroidal coil 1 can be inserted into the printed board 2 around the through hole 3 and the toroidal coil 1 is in a position that faces the through hole 3.

An annular coil mount 4 is interposed between the toroidal coil 1 and the printed board 2. The coil mount 4 is formed of a synthetic resin plate having insulation properties to ensure insulation between the coil conductor of the toroidal coil 1 except the soldered portion and the printed board 2 and has a function to define the attachment height of the toroidal coil 1 relative to the printed board 2.

The printed board 2 where the toroidal coil 1 and the other elements are mounted is fixed in a predetermined attachment position in a housing 5. The housing 5 is formed of metal with excellent thermal conductivity into a substantially cuboid-like shape and, in a state where the printed board 2 is attached in the housing 5, a substantially cylinder-like projection 6 is formed in a position that faces the through hole 3.

The projection 6 is formed toward the printed board 2 attached in the predetermined position so as to have a height and a diameter with which the projection 6 projects in the through hole 3. Specifically, the projection 6 is formed so as to have a height with which the projection 6 projects to an intermediate portion of the printed board 2 in its thickness direction in the through hole 3 and is formed so as to have a diameter with which the projection 6 faces the coil conductor of the toroidal coil 1. A heat radiation sheet 7 is attached on an upper surface of the projection 6. The heat radiation sheet 7 is made from, for example, a silicone-based material excellent in thermal conductivity and has flexibility for close contact with the coil conductor of the toroidal coil 1.

When the printed board 2 is attached in the housing 5, the heat radiation sheet 7 is sandwiched between the coil conductor of the toroidal coil 1 and the projection 6 and is thermally coupled.

Figure 3:
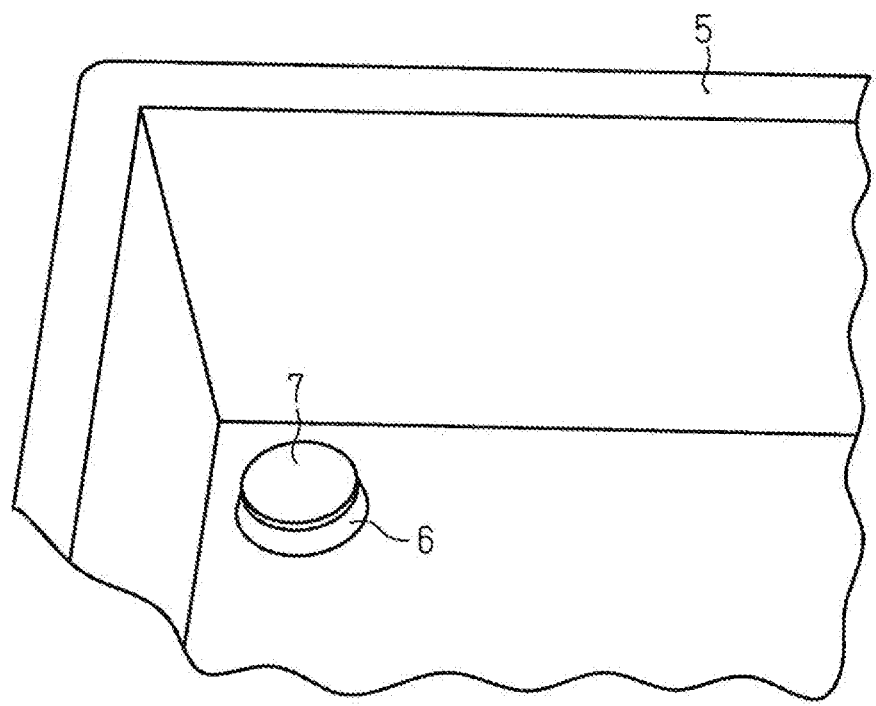
FIG. 3 is a perspective view that illustrates another example of a projection.

The projection 6 is formed by cutting part of the housing 5 out. Thus, the projection 6 is integrally formed with the housing 5 and stable thermal conductivity from the projection 6 to the housing 5 is ensured. As illustrated in FIG. 3, the projection 6 may be formed by performing a drawing process on part of the housing 5.

The projection 6 is formed so that when the printed board 2 is attached in the housing 5, the center of the projection 6 in its radial direction substantially accords with the coil center of the toroidal coil 1.

A heat radiation fin 8 is formed on the underside of the base of the housing 5 and radiates the heat radiated from the toroidal coil 1 and the other heating elements to the housing 5 to the outside of the housing 5.

The action of the toroidal coil 1 mounted over the printed board 2 in the housing 5 as described above is described below.

To place the printed board 2 in the housing 5, the toroidal coil 1 and the other elements are mounted over a front surface of the printed board 2 in advance, and the toroidal coil 1 and the other elements are soldered on a wiring pattern on a back surface of the printed board 2. Among the components except the toroidal coil 1, the surface-mounted components are soldered by a reflow process first, and then the components with terminals, which include the toroidal coil 1, are soldered by a flow process. The projection 6 is formed on the base of the housing 5 in advance and the heat radiation sheet 7 is placed on the upper surface of the projection 6.

When the printed board 2 is subsequently secured in the predetermined position in the housing 5, the projection 6 projects to an intermediate portion of the printed board 2 in its thickness direction and the toroidal coil 1 on the side of the printed board 2 is thermally coupled to the projection 6 with the heat radiation sheet 7 interposed therebetween.

When, after that, a control board of the inverter, a PV converter board, and a control board of the PV converter board, and so on are attached in the housing 5 and the housing 5 is hermetically sealed by attaching a top plate, a hermetically sealed power conditioner is formed as a result.

In the power conditioner structured as described above, when the toroidal coil 1 generates heat, the heat is radiated from the projection 6 to the housing 5 and radiated from the heat radiation fin 8 to the outside of the housing 5. Thus, the heat generated from the toroidal coil 1 is efficiently radiated.

The above-described attachment structure of the toroidal coil 1 can bring advantages enumerated below.

(1) The heat generated from the toroidal coil 1 can be radiated to the housing 5 through the projection 6, which projects in the through hole 3 of the printed board 2. Thus, after soldering the toroidal coil 1 on the printed board 2, formation of a radiation path to the heat radiation fin 8 owing to the projection 6 can be achieved together with the attachment of the printed board 2 into the housing 5.

(2) The projection 6 is integrally formed with the base portion of the housing 5 by cutting out from a member that constitutes the base portion of the housing 5 or by a drawing process. Since extra preparation of a member for thermally coupling the toroidal coil 1 to the housing 5 is unnecessary, an increase in the number of components can be inhibited.

(3) Since the heat radiation sheet 7 is sandwiched between the toroidal coil 1 and the projection 6, the heat radiation sheet 7 can be caused to come into close contact with the toroidal coil 1 and the projection 6. Accordingly, the heat generated from the toroidal coil 1 can be radiated stably to the projection 6 through the heat radiation sheet 7.

(4) Spacing between the toroidal coil 1 mounted over the printed board 2 and the upper surface of the projection 6 can be easily managed by managing the height of the projection 6 from the base of the housing 5, the height of a rib for attaching the printed board 2 into the housing 5, and the thickness of the coil mount 4. Accordingly, when the printed board 2 over which the toroidal coil 1 is mounted is placed in the housing 5, the heat radiation sheet 7 can be sandwiched and fixed between the toroidal coil 1 and the projection 6 stably and in addition, selection of the thickness of the heat radiation sheet 7 can be facilitated.

(5) Since extra preparation of a radiation member for thermal coupling with the housing 5 is unnecessary on the upper surface side of the toroidal coil 1, reduction in the profile of the printed board 2 over which the toroidal coil 1 is mounted can be achieved. As a result, reduction in the profile of the substantially cuboid-like housing 5 can be achieved.

(6) The heat generated from the toroidal coil 1 can be radiated to the outside of the housing 5 by using the heat radiation fin 8 provided on the underside of the housing 5 to radiate the heat generated from the other heating elements, which include a switching element, to the outside of the housing 5. Accordingly, the heat generated from the toroidal coil 1 can be radiated from the heat radiation fin 8 to the outside of the housing 5 without preparing another heat radiation fin.

(7) Decrease in radiation effect accompanied with positional deviation between the toroidal coil 1 and the projection 6 can be prevented by causing the coil center of the toroidal coil 1 and the centers of the through hole 3 and the projection 6 to substantially accord with each other.

The above-described embodiment may be changed as follows.

The structure according to the above-described embodiment may be used as a radiation structure for radiating the heat generated from the heating elements except the toroidal coil, which are a switching transistor, a central processing unit (CPU), and a battery for example.

The housing may be formed of a synthetic resin having thermal conductivity.

As regards the projection, a mount separate from the housing may be provided on the base of the housing.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. An electronic device comprising:
    a printed board having first and second opposing surfaces and defining a through hole extending between the first and second surfaces;
    a heating element adjacent the first surface of the printed board and extending over the through hole; and
    a hermetically sealed housing that has thermal conductivity and accommodates the printed board within an internal space defined by the hermetically sealed housing, the hermetically sealed housing including
    an integral projection on an internal surface and that extends into the internal space by the hermetically sealed housing, the projection extending into the through hole and thermally coupled to the heating element through the through hole,
    wherein the heating element is a toroidal coil and a coil center of the toroidal coil is positioned to accord with centers of the through hole and the projection.

2. The electronic device according to claim 1, wherein the through hole has a diameter smaller than an outside diameter of the toroidal coil.

3. The electronic device according to claim 1, further comprising a heat radiation sheet between the toroidal coil and the projection.

4. The electronic device according to claim 3, wherein the heat radiation sheet comprises a thermally conductive material.

5. The electronic device according to claim 4, wherein the thermally conductive material is a silicone-based material.

6. The electronic device according to claim 3, further comprising a coil mount between the toroidal coil and the printed board.

7. The electronic device according to claim 6, wherein the coil mount is formed of a synthetic resin plate having insulation properties.

8. The electronic device according to claim 1, wherein the projection is a cut out part of the housing.

9. The electronic device according to claim 1, wherein the projection is a drawn out part of the housing.

10. The electronic device according to claim 1, further comprising a heat radiation fin on an outer surface of the housing.

11. An electronic device comprising: a printed hoard having first and second opposing surfaces and defining a through hole extending between the first and second surfaces;
    a heating element adjacent the first surface of the printed board and extending over the through hole; and
    a hermetically sealed housing that has thermal conductivity and accommodates the printed board within an internal space defined by the hermetically sealed housing, the hermetically sealed housing including
    a single projection extending from an internal surface thereof into the internal space, the single projection extending into the through hole, thermally coupled to the heating element through the through hole and supporting the heating element above the internal space,
    wherein the heating element is a toroidal coil and a coil center of the toroidal coil is positioned to accord with centers of the through hole and the projection.

12. The electronic device according to claim 11, wherein the through hole has a diameter smaller than an outside diameter of the toroidal coil.

13. The electronic device according to claim 11, wherein the single projection is integral with the hermetically sealed housing.

14. The electronic device according to claim 11, wherein the projection is a cut out part of the housing.

15. The electronic device according to claim 11, wherein the projection is a drawn out part of the housing.

* * * * *